United States Patent
Fujimaki

Patent Number: 5,492,845
Date of Patent: Feb. 20, 1996

[54] METHOD OF PRODUCING MOS DEVICES

[75] Inventor: Nobuyoshi Fujimaki, Annaka, Japan

[73] Assignee: Shin-Etsu Handotai Co., Ltd., Tokyo, Japan

[21] Appl. No.: 181,090

[22] Filed: Jan. 13, 1994

[30] Foreign Application Priority Data

Jan. 18, 1993 [JP] Japan .................................. 5-005698

[51] Int. Cl.$^6$ .............................................. H01L 21/8232
[52] U.S. Cl. ............... 437/40; 437/233/247; 148/DIG. 3
[58] Field of Search ................................ 437/40, 41, 233, 437/247; 148/DIG. 3

[56] References Cited

U.S. PATENT DOCUMENTS

| | | | |
|---|---|---|---|
| 4,151,007 | 4/1979 | Levinstein et al. | 437/247 |
| 4,210,473 | 7/1980 | Takagi et al. | 437/247 |
| 4,464,824 | 8/1984 | Dickman et al. | 148/DIG. 3 |
| 5,299,311 | 7/1993 | Lai et al. | 437/52 |

FOREIGN PATENT DOCUMENTS

| | | |
|---|---|---|
| 0093848 | 11/1983 | European Pat. Off. . |
| 0071237 | 4/1987 | Japan . |

*Primary Examiner*—Tom Thomas
*Attorney, Agent, or Firm*—Nikaido, Marmelstein, Murray & Oram

[57] ABSTRACT

In a method of manufacturing a MOS device, of the type wherein an electrode film is deposited on a gate oxide film, after which a plurality of heat-treating steps are carried out in ambient gases and at a temperature range between 800° and 110° C., at least one of the heat-treating steps is carried out in a hydrogen atmosphere. The resultant MOS device has improved a time-dependent dielectric breakdown characteristics and maintained an improved time-zero dielectric breakdown characteristics which is comparable to that provided by the conventional hydrogen annealing.

12 Claims, 3 Drawing Sheets

5,492,845

METHOD OF PRODUCING MOS DEVICES

BACKGROUND OF THE INVENTION

1. Field of the Invention

The present invention relates generally to a method of producing a metal-oxide-semiconductor structure (MOS) device, and more particularly to such a method which is capable of improving tile reliability of a gate oxide film of the MOS device.

2. Description of the Prior Art

In a semiconductor integrated circuit (IC), each device element requires a gate oxide film which is highly reliable due to a high dielectric breakdown voltage and a small leakage current during operation. The material used in such semiconductor IC generally consists of a CZ-Si single crystal substrate (viz., a substrate fabricated from a silicon single crystal grown by Czochralsky method). However, the CZ-Si single crystal semiconductor substrate contains microscopic defects which will deteriorate the dielectric breakdown characteristics of the oxide film.

Accordingly, if a semiconductor substrate having such microscopic defects is used for fabricating an IC, the resultant IC would have problems, such as an oxidation induced stacking fault (OSF) and insufficient dielectric breakdown characteristics of the oxide film. In order to obtain a semiconductor substrate which is free from the OSF problem and which has an oxide film of excellent dielectric breakdown characteristics, there has been proposed a method in which a heat treatment is carried out in a hydrogen atmosphere (Japanese Patent Laid-open Publication Nos. 61-193456 and 62-123098). The proposed heat treatment is hereinafter referred to as "hydrogen annealing".

The proposed method in which the hydrogen annealing is used is employed for the production of a MOS device. One example of such known method is shown in FIG. 3.

According to the known method shown in FIG. 3, a polished wafer of CZ-Si single crystal is cleaned and then annealed in a hydrogen atmosphere. The annealed CZ-Si single crystal wafer is thermally oxidized in an appropriate ambient atmosphere, for example a dry oxygen atmosphere, in order to form a gate oxide film on the CZ-Si single crystal wafer. Then, a polysilicon film is deposited by low pressure chemical vapor deposition (LPCVD) method, after which phosphorus is deposited by a $POCl_3$ method. Subsequently, a phosphorus diffusion step commonly termed "drive-in annealing" step is performed in an inert gas atmosphere, after which an electrode pattern is formed by photolithography which includes a sequence of processing steps such as photoresist coating, polysilicon etching and photoresist stripping.

The prior method described above, due to the heat-treating step required for achieving the hydrogen annealing, raises another problem such as slip (one of crystal defects) or contamination. In particular, the contamination problem is as reported in the Extended Abstracts of the 18th (1986 International) Conference on Solid State Devices and Materials, Tokyo, 1986, pp. 529–532, "Improvement of Silicon Surface Quality by $H_2$ anneal". The reported contamination level does not affect the time-zero dielectric breakdown (TZDB) strength of the oxide film. However, in subsequent research, the present inventor discovered that the contamination level is sufficient to exert a negative influence on the time-dependent dielectric breakdown (TDDB) characteristics of the oxide film.

SUMMARY OF THE INVENTION

With the foregoing drawbacks of the prior art in view, the present invention seeks to provide a method of producing a MOS device, which is capable of improving the TDDB characteristics of an oxide film while maintaining improved TZDB characteristics of the oxide film which are equivalent to those attained by the hydrogen annealing used in the prior art.

To attain the foregoing object, the invention provides, in one aspect, a method of producing a MOS device, of the type wherein an electrode film is formed on a gate oxide film, after which a plurality of heat-treating steps are carried out in ambient gases and at a temperature range between 800° and 1100° C. characterized in that at least one of the heat-treating steps is carried out in a hydrogen atmosphere.

In another aspect the invention provides a method of producing a MOS device, of the type wherein a polysilicon film is deposited on a gate oxide film, after which a dopant is diffused by a drive-in annealing process for controlling the resistance of the polysilicon film, characterized in that the drive-in annealing process is carried out in a hydrogen atmosphere and at a temperature range between 800° and 1100° C. for 4 hours or less. The drive-in annealing process, if achieved at a temperature exceeding 1100° C. and for a period exceeding 4 hours, would force the dopant to penetrate or drive through the gate oxide film, rendering the resultant semiconductor device inoperative. The drive-in temperature if lower than 800° C. would negate the prescribed effect of hydrogen in the ambient gas. The dopant may be phosphorus (P), boron (B) or the like.

As previously mentioned, in order to improve the TZDB charactreristics of the oxide film, the conventional method has one additional heat treating step that is hydrogen annealing this has been found to cause various problems such as generation of slip and contamination as well as deterioration of the TDDB characteristics of the gate oxide film.

According to the present invention, an un-annealed CZ-Si single crystal wafer is heat-treated in a hydrogen atmosphere in the course of production of a semiconductor device. Thus, the number of heat-treating steps in the present invention is less by one than that in the conventional method with the result that the corresponding reduction in the generation of a slip can be attained.

Furthermore, in the method of the present invention, the hydrogen annealing is done with the gate oxide film covered with the electrode film. Accordingly, even when the hydrogen annealing is effected in the presence of contaminants, there is no influence of the contaminants, by gettering to the electrode film, on the TDDB characteristics of the oxide film.

Insofar as the production cost of the MOS device is concerned, the conventional method requires a relatively high production cost and a long production time because pre-cleaning and hydrogen annealing are achieved before the gate oxidation process. As against the conventional method, the present method does not require the pre-cleaning and hydrogen annealing before the gate oxidation. Moreover, in the method of the invention wherein a plurality of heat-treating steps are done after an electrode film is deposited on the gate oxide film, at least one of the heat-treating steps is carried out in a hydrogen atmosphere. Due to the omission of the pre-cleaning and hydrogen annealing, a corresponding reduction in the production cost and time can be attained by the present invention.

Many other objects, advantages and features of the present invention will be better understood from the following description taken in conjunction with the accompanying drawings.

DETAILED DESCRIPTION OF THE INVENTION

Figure 1:
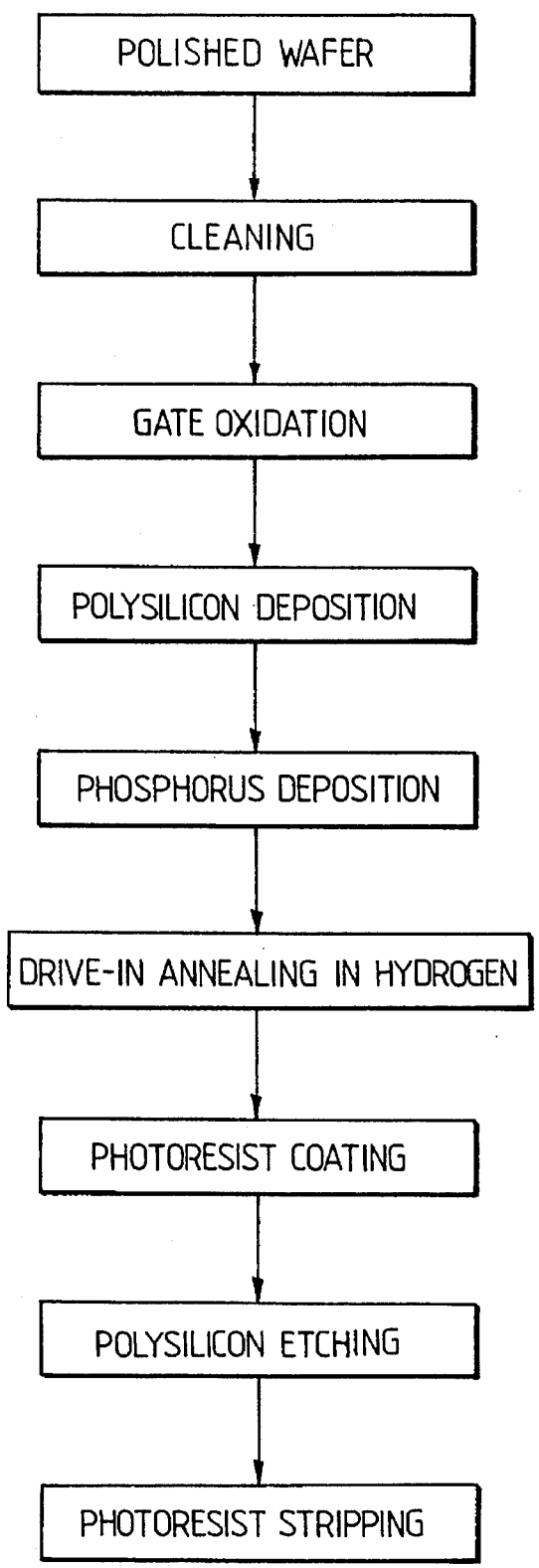
FIG. 1 is a flowchart showing a sequence of processing steps achieved in a method of producing a MOS device according to the present invention.

Referring to FIG. 1, there is shown a sequence of processing steps achieved in a method of the present invention for producing a MOS device.

As shown in FIG. 1, a polished wafer of CZ-Si single crystal is cleaned and then thermally oxidized in a dry oxygen atmosphere at a temperature of 900° C. so as to form a 25 nm-thickness, gate oxide film on the cleaned CZ-Si single crystal wafer. Then, a 300 nm-thickness, polysilicon film is deposited by low pressure chemical vapor deposition (LPCVD) method achieved at 620° C. after which phosphorus is deposited at 850° C. using the POCl$_3$ method. Subsequently, a phosphorus diffusion step commonly termed "drive-in annealing" step is carried out in a hydrogen atmosphere and at a temperature range between 800° to 1100° C. for 4 hours or less. Thereafter, an electrode pattern is formed by the photolithography which includes a sequence of processing steps such as photoresist coating, polysilicon etching and photoresist stripping.

The invention will now be described by way of the following examples which should be construed as illustrative rather than restrictive.

EXAMPLES 1 and 2

Two CZ-Si single crystal wafers (Diameter: 5 mm, Orientation: <100>, Conductivity: p-type, Resistivity: 10 ncm, Crystal Growth Rate: 1.1 mm/min) were prepared. Each wafer was cleaned and then oxidized by heating at 900° C. in a dry oxygen atmosphere so as to grow a gate oxide film of 25 nm in thickness. Subsequently, a 300 nm-thickness, polysilicon film was deposited at 620° C. by the LPCVD method, after which phosphorus was deposited at 850° C. by the POCl$_3$ method. Thereafter, a phosphorus diffusion step commonly termed "drive-in annealing" step was carried out in a hydrogen atmosphere for 30 minutes and at two different temperatures of 900° C. (Example 1) and 1000° C. (Example 2). Thus, MOS diodes each having a phosphorous-doped polysilicon electrode were fabricated on the wafer.

Figure 2:
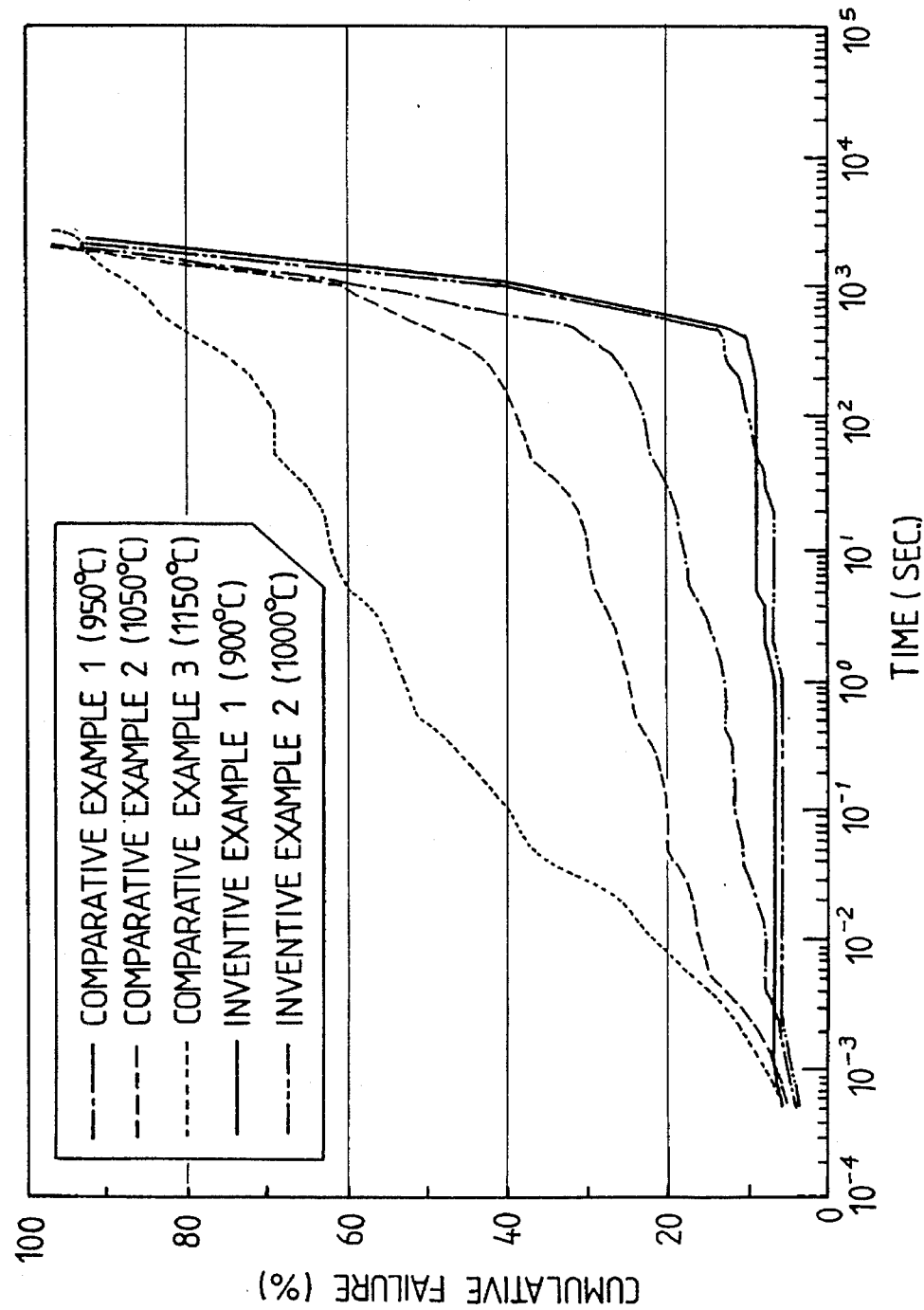
FIG. 2 is a graph showing the time-dependent dielectric breakdown characteristics of inventive examples and comparative examples.
Figure 3:
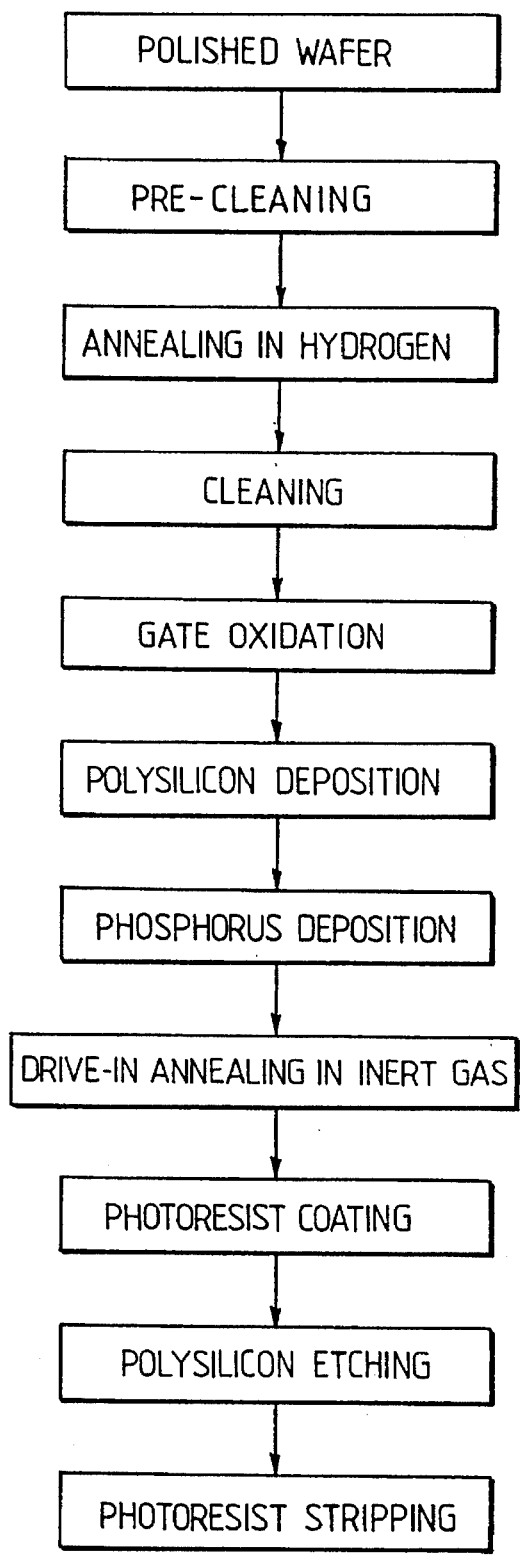
FIG. 3 is a flowchart showing a sequence of processing steps achieved in a conventional method of producing a MOS device.

Then, 100 sample MOS diodes fabricated on each wafer were measured for the TDDB characteristics by applying a constant voltage stress of −12 MV/cm to each sample MOS diode with a gate area of 1 mm$^2$. The measurements thus obtained are shown in FIG. 2. As appears clear from FIG. 2, the MOS diodes (Inventive Examples 1 and 2) fabricated by the method of the present invention exhibit excellent TDDB characteristics.

Though not shown, the sample MOS diodes of Inventive Examples 1 and 2 were also tested for the TZDB characteristics of the oxide films under the following conditions: Gate area: 8 mm$^2$, Current density in decision: 1 mA/cm$^2$, Number of samples: 100 pieces/wafer. The test results showed that the non-defective percent of the sample diodes according to each of Inventive Examples 1 and 2 was substantially equal to that of the conventional MOS diodes.

COMPARATIVE EXAMPLES 1–3

For comparative purposes, CZ-Si single crystal wafers prepared in the same batch as those in Inventive Examples 1 and 2 were cleaned and then annealed in a hydrogen atmosphere for 30 minutes and at three different temperatures of 950° C. (Comparative Example 1), 1050° C. (Comparative Example 2) and 1150° C. (Comparative Example 3). Each of the annealed wafers was thermally oxidized in a dry oxygen atmosphere heated at 900° C. so as to grow a gate oxide film of 25 nm in thickness. Then, a 300 nm-thickness, polysilicon film was deposited at 620° C. using the LPCVD method, after which phosphorus was deposited at 850° C. using the POCl$_3$ method. Subsequently, the drive-in annealing step was carried out in an inert gas atmosphere and at a temperature of 1000° C. for 30 minutes. From each of the resultant wafers, MOS diodes having a phosphorus-doped polysilicon electrode were fabricated.

The thus fabricated MOS diodes were measured for the TDDB characteristics under the same conditions as Inventive Examples 1 and 2 described above. The measurement thus obtained are shown in FIG. 2. As is apparent from FIG. 2, the TDDB characteristics of Comparative Examples 1–3 are not so good as those of Inventive Examples 1 and 2. Furthermore, the TDDB characteristics degrades as the hydrogen annealing temperature increases.

According to the method of the present invention, the improved TZDB characteristics of the oxide film which are comparative to those attained by the conventional hydrogen annealing can be maintained. The number of heat-treating steps in the inventive method is less by one than that in the conventional method. This makes it possible to prohibit the generation of a slip, reduce the production time and cost, and improve the TDDB characteristics of the MOS device.

The present invention is also applicable to a metal-insulator-semiconductor (MIS) device. As the insulator film, there are nitride, nitride-oxide, oxide-nitride-oxide, alumina, alumina-oxide and so forth.

What is claimed is:

1. A method of producing an MOS device comprising depositing a polysilicon film on a gate oxide film, and then diffusing a dopant into said polysilicon film, by a drive-in annealing process, for controlling the resistance of the polysilicon film, wherein said drive-in annealing process is carried out in a hydrogen atmosphere and at a temperature range between 800° and 1100° for 4 hours or less.

2. A method according to claim 1, wherein said dopant is phosphorus or boron.

3. A method of producing an MIS device, comprising depositing a polysilicon film on a gate insulator film, and then diffusing a dopant into said polysilicon film by a drive-in annealing process for controlling the resistance of the polysilicon film, wherein said drive-in annealing process is carried out in a hydrogen atmosphere and at a temperature range between 800° and 1100° C. for 4 hours or less.

4. A method according to claim 3, wherein said dopant is phosphorus or boron.

5. In the process of forming an MOS device which comprises:

forming a wafer of single crystal material;

hydrogen annealing said single crystal material wafer;

oxidizing a surface of said annealed single crystal material wafer sufficient to form a gate oxide film thereon;

depositing a polysilicon film on said gate electrode;

depositing a layer comprising a dopant on said polysilicon film;

carrying out a plurality of heat treating steps in ambient atmosphere at a temperature of about 800° to 1100° C., including at least one drive-in annealing step under an inert gas atmosphere, sufficient to diffuse said dopant into said polysilicon layer; and forming an electrode pattern by photolithography;

the improvement which comprises:

not subjecting said single crystal material to hydrogen annealing prior to oxidizing said wafer surface;

not drive-in annealing said dopant under an inert gas atmosphere; and after depositing said dopant layer, and without increasing the number of said plurality of heat treating steps, carrying out at least one of said plurality of heat treating steps in a hydrogen atmosphere under hydrogen annealing conditions sufficient to drive said dopant into said polysilicon film.

6. The improved process as claimed in claim 5 wherein said heat treating step carried out under a hydrogen atmosphere is carried out for a period of not more than about 4 hours.

7. The improved process as claimed in claim 5 wherein said dopant is a member selected from the group consisting of boron and phosphorus.

8. The improved process as claimed in claim 5 wherein, as a result of practicing said improved process, said MOS device has, as compared to an otherwise substantially the same MOS device made by carrying out said hydrogen annealing step prior to oxidation of said wafer:

time zero dielectric breakdown (TZDB) characteristics of said gate electrode film which are at least maintained, time dependent dielectric breakdown (TDDB) characteristics of said gate electrode film which have reduced deterioration, and a reduction in slip characteristic.

9. In the process of forming an MIS device which comprises:

forming a wafer of single crystal material;

hydrogen annealing said single crystal material wafer;

oxidizing a surface of said annealed single crystal material wafer sufficient to form a gate oxide film thereon;

depositing a polysilicon film on said gate electrode;

depositing a layer comprising a dopant on said polysilicon film;

carrying out a plurality of heat treating steps in ambient atmosphere at a temperature of about 800° to 1100° C., including at least one drive-in annealing step under an inert gas atmosphere, sufficient to diffuse said dopant into said polysilicon layer; and forming an electrode pattern by photolithography;

the improvement which comprises:

not subjecting said single crystal material to hydrogen annealing prior to oxidizing said wafer surface;

not drive-in annealing said dopant under an inert gas atmosphere; and after depositing said dopant layer, and without increasing the number of said plurality of heat treating steps, carrying out at least one of said plurality of heat treating steps in a hydrogen atmosphere under hydrogen annealing conditions sufficient to drive said dopant into said polysilicon film.

10. The improved process as claimed in claim 9 wherein said heat treating step carried out under a hydrogen atmosphere is carried out for a period of not more than about 4 hours.

11. The improved process as claimed in claim 9 wherein said dopant is a member selected from the group consisting of boron and phosphorus.

12. The improved process as claimed in claim 9 wherein, as a result of practicing said improved process, said MOS device has, as compared to an otherwise substantially the same MOS device made by carrying out said hydrogen annealing step prior to oxidation of said wafer:

time zero dielectric breakdown (TZDB) characteristics of said gate electrode film which are at least maintained, time dependent dielectric breakdown (TDDB) characteristics of said gate electrode film which have reduced deterioration, and a reduction in slip characteristic.

* * * * *